(12) United States Patent
Heshami et al.

(10) Patent No.: US 7,446,365 B1
(45) Date of Patent: Nov. 4, 2008

(54) FABRICATED LAYERED CAPACITOR FOR A DIGITAL-TO-ANALOG CONVERTER

(75) Inventors: Mehrdad Heshami, Palo Alto, CA (US); Mansour Keramat, San Jose, CA (US)

(73) Assignee: Alvand Technologies, Inc., Santa Clara, CA (US)

( * ) Notice: Subject to any disclaimer, the term of this patent is extended or adjusted under 35 U.S.C. 154(b) by 125 days.

(21) Appl. No.: 11/371,257

(22) Filed: Mar. 7, 2006

(51) Int. Cl.
*H01L 27/108* (2006.01)

(52) U.S. Cl. .................. 257/303; 257/296; 257/298; 257/306; 257/307; 257/308; 341/150

(58) Field of Classification Search .......... 257/296, 257/298, 300, 303, 306, 307, 308; 341/150
See application file for complete search history.

(56) References Cited

U.S. PATENT DOCUMENTS

| | | | |
|---|---|---|---|
| 6,690,570 B2 | 2/2004 | Hajimiri | |
| 6,743,671 B2 * | 6/2004 | Hu et al. | 438/253 |
| 2006/0261394 A1 | 11/2006 | Chien | |

* cited by examiner

*Primary Examiner*—Evan Pert
*Assistant Examiner*—Tan N Tran
(74) *Attorney, Agent, or Firm*—Stattler-Suh PC

(57) ABSTRACT

A fabricated layered capacitor having three layers is provided. The first bottom layer comprises a first bottom plate portion, the second middle layer comprises a first top plate portion, and the third top layer comprises a second bottom plate portion of the layered capacitor. A set of vias connects the first and second bottom plate portions. The top plate portion may extend past the bottom plate portions. The layered capacitor may have a different number of layers (e.g., five layers). The layers may comprise metal layers produced using semiconductor fabrication methods. Also provided is a capacitor array having two or more layered capacitors where connectors connect all top plate portions of the capacitors. The capacitor array may be used in a capacitive DAC, the capacitors being connected according to the architecture of the DAC. The capacitive DAC may be used in a SAR ADC.

14 Claims, 6 Drawing Sheets to each other and also coupled to one or more processing circuits 125 of the DAC. Each bottom plate 115 is typically connect to a switch 120 that couples and decouples the bottom plate of the capacitor to various processing circuits 125 of the DAC.

FABRICATED LAYERED CAPACITOR FOR A DIGITAL-TO-ANALOG CONVERTER

FIELD OF THE INVENTION

The invention is directed towards a fabricated layered capacitor for a digital-to-analog converter.

BACKGROUND OF THE INVENTION

A digital-to-analog converter (DAC) converts digital code into an analog signal and has a multitude of applications (e.g., in audio, video, signal processing, etc.). To perform this conversion, DACs may implement various components, such as switches, resistors, current sources, or capacitors. In particular, a capacitive DAC uses a bank of capacitors (comprising a plurality of capacitors having various capacitance values) and typically requires lower power as compared to other types of DACs. A capacitive DAC is a particularly useful component in mixed signal circuits.

However, for a capacitive DAC to achieve sufficient accuracy, large capacitors must typically be used in the capacitor bank. As known in the art, this is due to the use of capacitance value ratios in the conversion process that require good capacitor matching and ratio accuracy which is improved by larger capacitance values. However, the use of large capacitors results in increased chip area, lower processing speed, and reduced power benefit of the capacitive DAC. Also, use of large capacitors makes it difficult to achieve high ratio accuracy in the capacitor bank due to parasitic capacitances resulting from electric fields of capacitors dispersing to neighboring components.

As such, there is a need for a capacitor bank having small size, low-capacitance values with high precision and accuracy, good capacitor matching, and good shielding with low parasitic capacitances for use in a capacitive DAC.

SUMMARY OF THE INVENTION

Some embodiments of the invention provide a fabricated layered capacitor composed of three layers. The first bottom layer comprises a first bottom plate portion (where the first bottom plate portion comprises the entirety of the first layer), the second middle layer comprises a first top plate portion between two second bottom plate portions, and the third top layer comprises a third bottom plate portion of the layered capacitor (where the third bottom plate portion comprises the entirety of the third layer). For the second layer (middle layer), the second bottom plate portion comprises two separate structures being unconnected across the second layer and the top plate is between the two separate structures, the bottom and top plate portions being separated by a distance. A set of vias connects the first, second, and third bottom plate portions. The first, second, and third bottom plate portions and the set of vias comprise a bottom plate of the layered capacitor and the first top plate portion comprises a top plate of the layered capacitor. In some embodiments, the top plate extends past the length of the bottom plate. In some embodiments, the layered capacitor has a different number of layers (e.g., five layers). In some embodiments, the layers comprise metal layers and the layered capacitor is produced using semiconductor fabrication methods used for producing integrated circuits.

Some embodiments of the invention provide a capacitor array having two or more fabricated layered capacitors arranged in columns and rows, where all top plate portions of layered capacitors of a same column are connected to form a unified top plate. The array also includes a set of connectors connecting the unified top plates of the columns of the array so that all top plate portions of the layered capacitors in the array are coupled. In some embodiments, the capacitor array is used in a capacitive DAC. The bottom plates of the capacitors in the array are connected according to the architecture of the DAC (e.g., binary weighted, segmented, etc.). In some embodiments, the capacitive DAC is used in a successive approximation analog-to-digital converter (SAR ADC).

BRIEF DESCRIPTION OF THE DRAWINGS

The novel features of the invention are set forth in the appended claims. However, for purpose of explanation, several embodiments of the invention are set forth in the following figures.

DETAILED DESCRIPTION OF THE INVENTION

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

I. Capacitive DAC

As known in the art, a capacitor is a device for storing an electric charge and is comprised of two plates (top and bottom plates) made of an electrically conducting material (such as metal) and separated by a nonconducting material or air. A voltage is applied to the plates and one plate becomes positively charged and the other negatively charged. As electric charge accumulates on the plates, an electric field is produced between the plates. If the applied voltage is removed, the plates of the capacitor remain charged and the presence of the electric field between the plates remains until it is discharged. The value of a capacitor's capacitance reflects the amount of charge stored on the plates and is expressed in farads. The capacitance is proportional to the surface area of the plates and inversely proportional to the distance between the plates. As such, capacitance can be increased by increasing the area of the plates.

Figure 1:
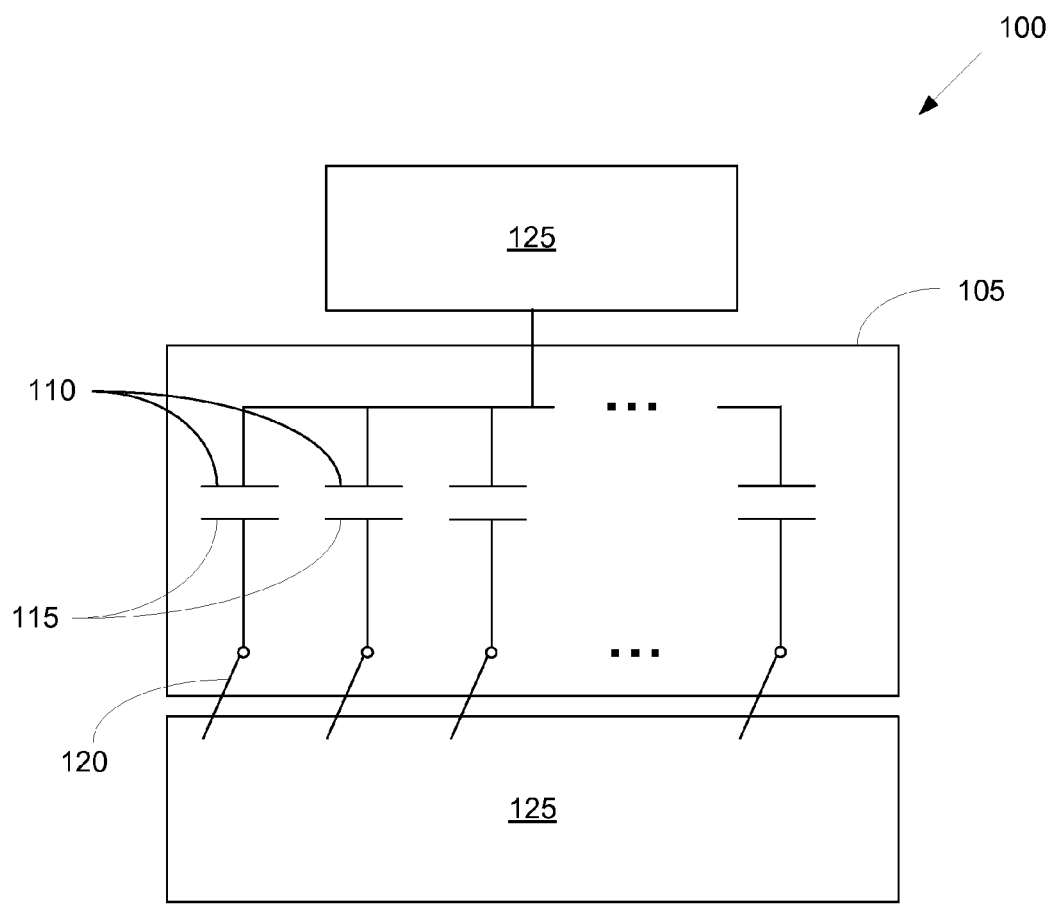
FIG. 1 is a block diagram of a generic capacitive DAC.

A capacitive DAC uses a bank of capacitors (comprising a plurality of capacitors having various capacitance values) and ratios of the capacitance values to convert a received digital code into an analog signal. FIG. 1 is a block diagram of a generic capacitive DAC 100 comprising a bank of capacitors 105 and various processing circuits 125. Each capacitor in the bank 105 has a top plate 110 and a bottom plate 115. As shown in FIG. 1, all top plates 110 of the capacitors are coupled to each other and also coupled to one or more processing circuits 125 of the DAC. Each bottom plate 115 is typically connect to a switch 120 that couples and decouples the bottom plate of the capacitor to various processing circuits 125 of the DAC.

The bottom plates 115 are coupled to the various processing circuits 125 according to the architecture of the DAC (e.g., binary weighted, segmented, etc.). The bank of capacitors 105 are used in conjunction with the various processing circuits 125 to convert the received digital code into the analog signal. The processing circuits 125 of the DAC are well known in the art and not discussed in detail here.

Examples of DAC architectures known in the art include pulse width modulator, oversampling (e.g., delta-sigma DAC), binary weighted, segmented, hybrid, etc. Regardless of the architecture type of a DAC, the resolution of a DAC is the number of possible output levels the DAC is configured to reproduce. DAC resolution is typically stated as the number of bits it uses (the bits going from a least significant bit (LSB) to a most significant bit (MSB)). In a binary weighted architecture, if a capacitor with capacitance A is used for the LSB, a capacitor with capacitance 2*A is used for the $2^{nd}$ LSB, a capacitor with capacitance 2*2*A is used for the $3^{rd}$ LSB, and so forth. In a segmented architecture, an equal capacitor segment is used for each possible value of the DAC output. For example, an 8-bit segmented DAC would have 256 segments and a 16 bit segmented DAC would have 65536 segments.

II. SAR ADC

Figure 2:
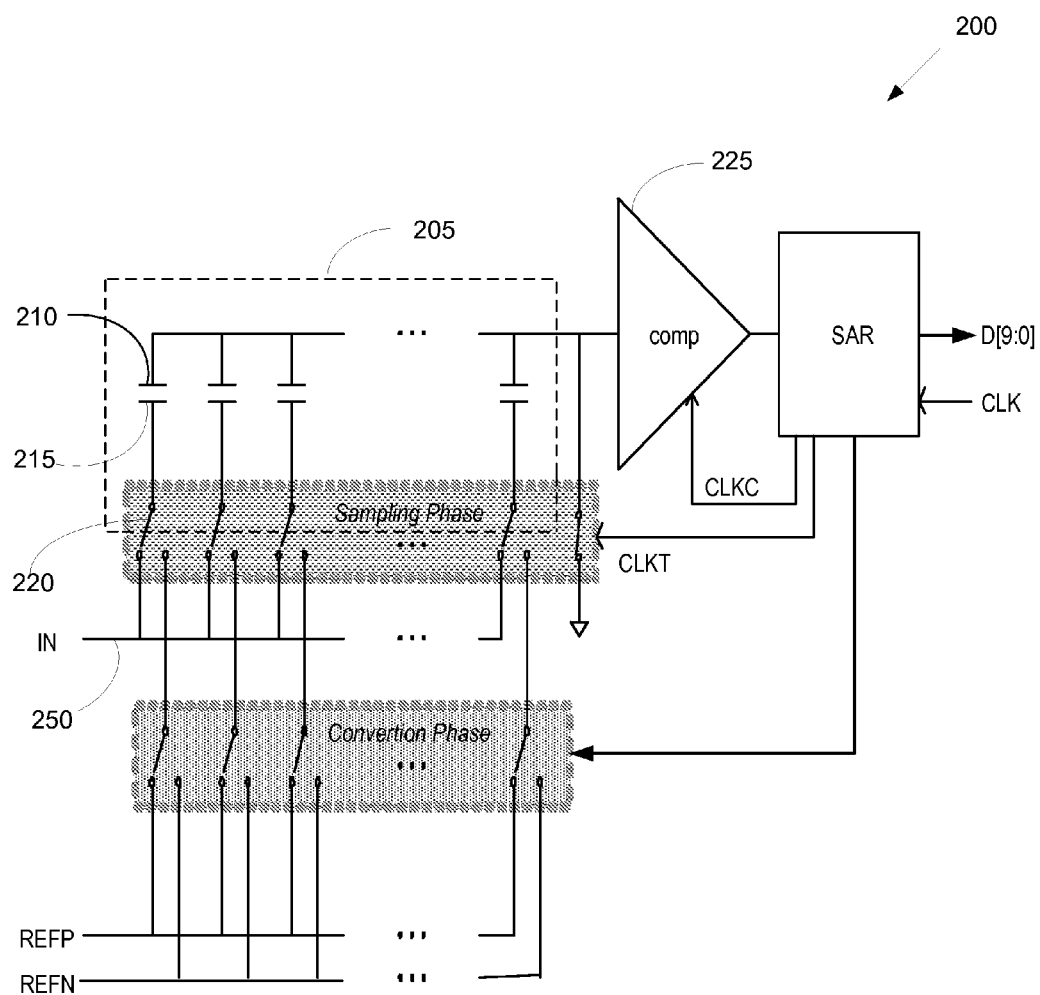
FIG. 2 is block diagram of a SAR ADC that uses a capacitive DAC.

A capacitive DAC is particularly useful in some analog-to-digital converters (ADCs), for example, a successive approximation analog-to-digital converter (SAR ADC). An ADC device converts a received analog signal into digital code output. FIG. 2 is block diagram of a SAR ADC 200 that uses a capacitive DAC. The SAR ADC 200 comprises a bank of capacitors 205 and various processing circuits. SAR ADCs are well known in the art and only a brief description of the components and operation of the SAR ADC is given here.

As shown in FIG. 2, all top plates 210 of the capacitors of the bank 205 are coupled to each other and also coupled to one or more processing circuits of the SAR ADC. Each bottom plate 215 is connected to a switch 220 that couples and decouples the bottom plate 215 of the capacitor to various processing circuits of the SAR ADC. The bottom plates 215 are coupled to the various processing circuits according to the architecture of the capacitive DAC (e.g., binary weighted, segmented, etc.) used in the SAR ADC.

During a sample phase, the SAR ADC 200 receives an analog signal (IN signal 250) and the switches 220 couple the bottom plates 215 of the capacitors to sample phase circuits of the SAR ADC to load the received signal across the capacitors in the bank 205. The SAR ADC 200 uses capacitance value ratios of the capacitors in the bank 205 and a comparator 225 to reject ranges of voltages of the received signal using successive approximation to set a final voltage range determination for the received signal. For example, in bit-weighting conversion (used in binary weighted architectures) the first comparison sets the MSB of the digital output, the second comparison sets the $2^{nd}$ MSB, the third comparison sets the $3^{rd}$ MSB, and so forth until the LSB of the digital output is set. During a conversion phase after the sample phase, the switches 220 are switched to couple the bottom plates 215 of the capacitors to the conversion phase circuits of the SAR ADC.

In a binary weighted architecture, the capacitor used for setting the MSB is shown as the farthest left capacitor in the bank 205, the capacitor used for setting the $2^{nd}$ MSB is shown as the $2^{nd}$ farthest left capacitor, and so forth, where the capacitor used for setting the LSB is shown as the farthest right capacitor in the bank. As discussed above, if a capacitor with capacitance A is used for the LSB, a capacitor with capacitance 2*A is used for the $2^{nd}$ LSB, a capacitor with capacitance 2*2*A is used for the $3^{rd}$ LSB, and so forth. As such, for a binary weighted DAC having 8 bit resolution, assuming that the capacitor used for setting the LSB has a capacitance value of 1 unit, the capacitance values of the capacitors in the bank 205 from left to right would be 128, 64, 32, 16, 8, 4, 2, and 1 units.

As discussed above, for a capacitive DAC to achieve sufficient accuracy, large capacitors must typically be used in the capacitor bank. However, the use of large capacitors results in increased chip area, lower processing speed, reduced power benefit, and parasitic capacitances.

III. Fabricated Layered Capacitor

Figure 3:
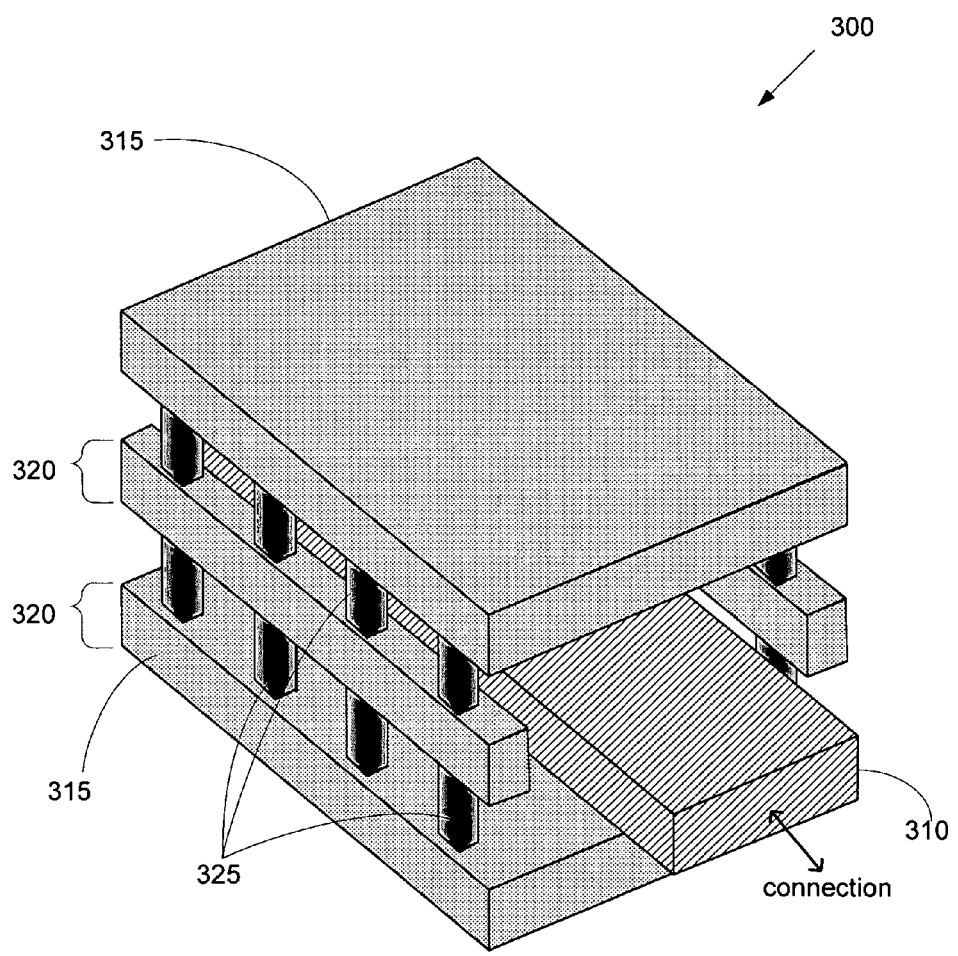
FIG. 3 shows a conceptual diagram of a fabricated layered capacitor formed from three layers.

A fabricated layered capacitor is provided herein to provide small size, low-capacitance values with high precision and accuracy, good capacitor matching, and good shielding with low parasitic capacitances that can be used, for example, in a capacitive DAC. FIG. 3 shows a diagram of a fabricated layered capacitor 300 comprising a top plate 310 and a bottom plate 315 formed from a plurality of layers 320 and vias 325. The layered capacitor 300 is made of three layers, but in other embodiments, the layered capacitor 300 is comprised of a different number of layers (e.g., five, seven, nine, etc.). As used herein, a "top layer" refers to the uppermost layer, a "bottom layer" refers to the lowest layer, an "upper layer" refers to any layer that is not the bottom layer, and a "lower layer" refers to any layer that is not the top layer of the layered capacitor.

The layered capacitor 300 has a first layer (bottom layer) that comprises a first portion of the bottom plate 315, a second layer (middle layer) that comprises the top plate 310 between two second bottom plate portions, and a third layer (top layer) that comprises a third portion of the bottom plate 315 of the layered capacitor 300. Note that the first bottom plate portion comprises the entirety of the first layer and the third bottom plate portion comprises the entirety of the third layer. Also note that for the second layer (middle layer), the second bottom plate portion comprises two separate structures being unconnected across the second layer and the top plate 310 is between the two separate structures, the bottom and top plate portions being separated by a distance.

The bottom plate portions of the first, second, and third layers are connected by a set of one or more vias 325. The bottom plate portions and the set of vias 325 comprise the bottom plate 315 of the capacitor 300. The top and bottom plates are separated by a distance so that the top plate 310 is shielded by the bottom plate 315 (since the top plate is on a layer that is between the layers comprising the bottom plates) but does not contact the bottom plate 315. The top plate 310 is enclosed by the bottom plate 315 except at two ends of the top plate 310.

In some embodiments, the length of the top plate extends past the length of the bottom plate to allow easy coupling/connection of the top plate to a connector or another top plate of another capacitor from the outside. In some embodiments, the top and bottom plates are composed of rectangular shaped pieces. In other embodiments, the top and bottom plates are composed of other shaped pieces.

Figure 4:
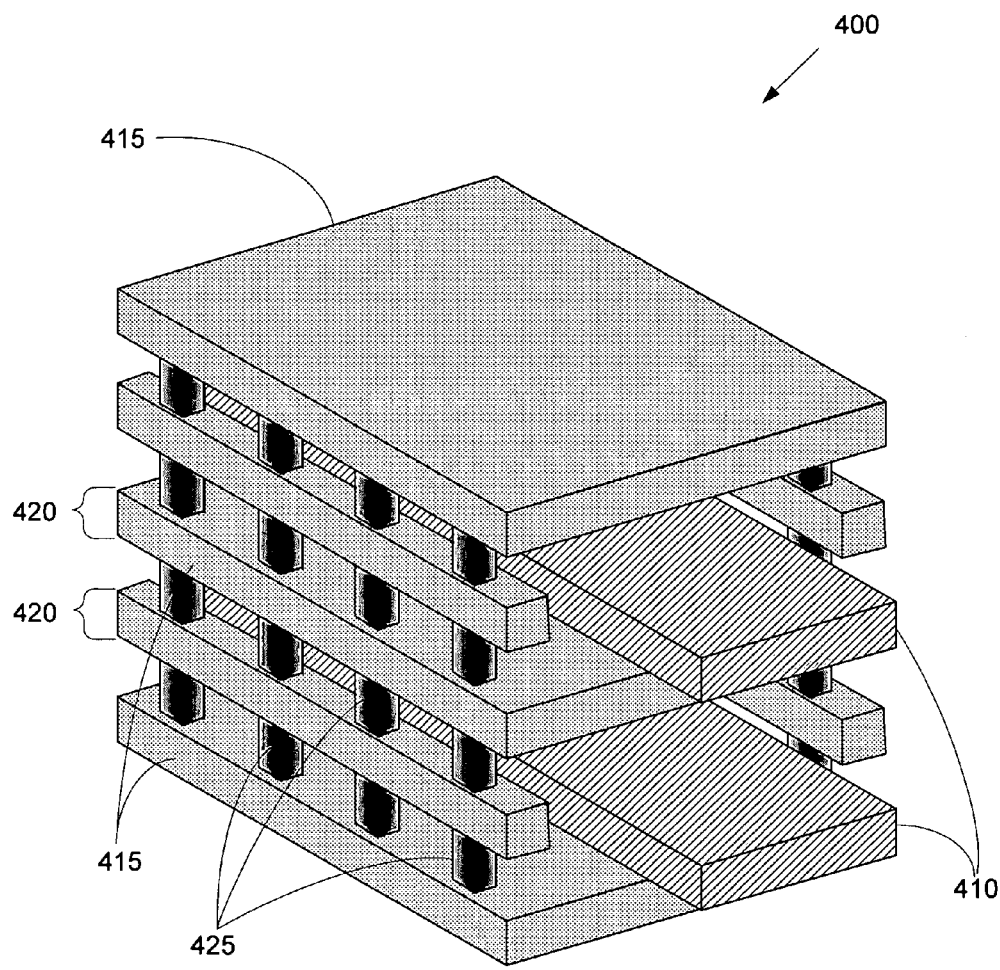
FIG. 4 shows a conceptual diagram of a fabricated layered capacitor formed from five layers.

FIG. 4 shows a diagram of a fabricated layered capacitor 400 formed from five layers 420 and comprising a top plate 410, a bottom plate 415, and a plurality of vias 425. The layered capacitor 400 has a first layer (bottom layer) that comprises a first portion of the bottom plate 415, a second layer that comprises a first portion of the top plate 410 between two second bottom plate portions, a third layer that comprises a third portion of the bottom plate 415 of the layered capacitor 400, a fourth layer that comprises a second portion of the top plate 410 between two fourth bottom plate portions, and a fifth layer (top layer) that comprises a fifth portion of the bottom plate 415 of the layered capacitor 400. Note that the first bottom plate portion comprises the entirety of the first layer, the second bottom plate portion comprises the entirety of the third layer, and the third bottom plate portion comprises the entirety of the fifth layer. Also note that for the second layer, the second bottom plate portion comprises two separate structures being unconnected across the second layer and the top plate is between the two separate structures, the bottom and top plate portions being separated by a distance. Similarly, for the fourth layer, the fourth bottom plate portion comprises two separate structures being unconnected across the fourth layer and the top plate is between the two separate structures, the bottom and top plate portions being separated by a distance.

The bottom plate portions of the first, third, and fifth layers are connected by a set of one or more vias 425. The bottom plate portions and the set of vias 425 comprise the bottom plate 415 of the capacitor 400. The top and bottom plates are separated by a distance so that each top plate portion 410 is enclosed and shielded by bottom plate portions 415 but does not contact any bottom plate portion 415. In some embodiments, the length of the top plate portions of the second and fourth layers extend past the length of the bottom plate to allow easy coupling/connection of the top plate.

In some embodiments, the layers of the layered capacitor are comprised of metal layers (e.g., M1, M2, M3, etc.), the metal layers being formed, for example, from any metal oxide or alloy, single element compounds or compositions of multiple metals, etc. In some embodiments, the layered capacitor is formed using semiconductor fabrication methods, for example, as conventionally used for producing integrated circuits. For example, the capacitor may be formed on a substrate of any material suitable for a capacitor (e.g., GaAs, silicon, germanium, etc.) where the bottom metal layer is formed on the substrate and upper layers are deposited one by one on top of the bottom metal layer. The capacitor may be formed by any deposition technique (e.g., chemical or physical vapor deposition, etc.). Methods of semiconductor fabrication are well known in the art and not discussed in detail here.

The layered capacitor can be used in a capacitor bank of a capacitive DAC where it is used and connected similar to a conventional capacitor in the bank. In some embodiments, the layered capacitor (whether having three, five, or another number of layers) comprises a single unit capacitor having a particular capacitance value A that is used for the LSB of a capacitive DAC.

IV. Capacitor Array

Figure 5:
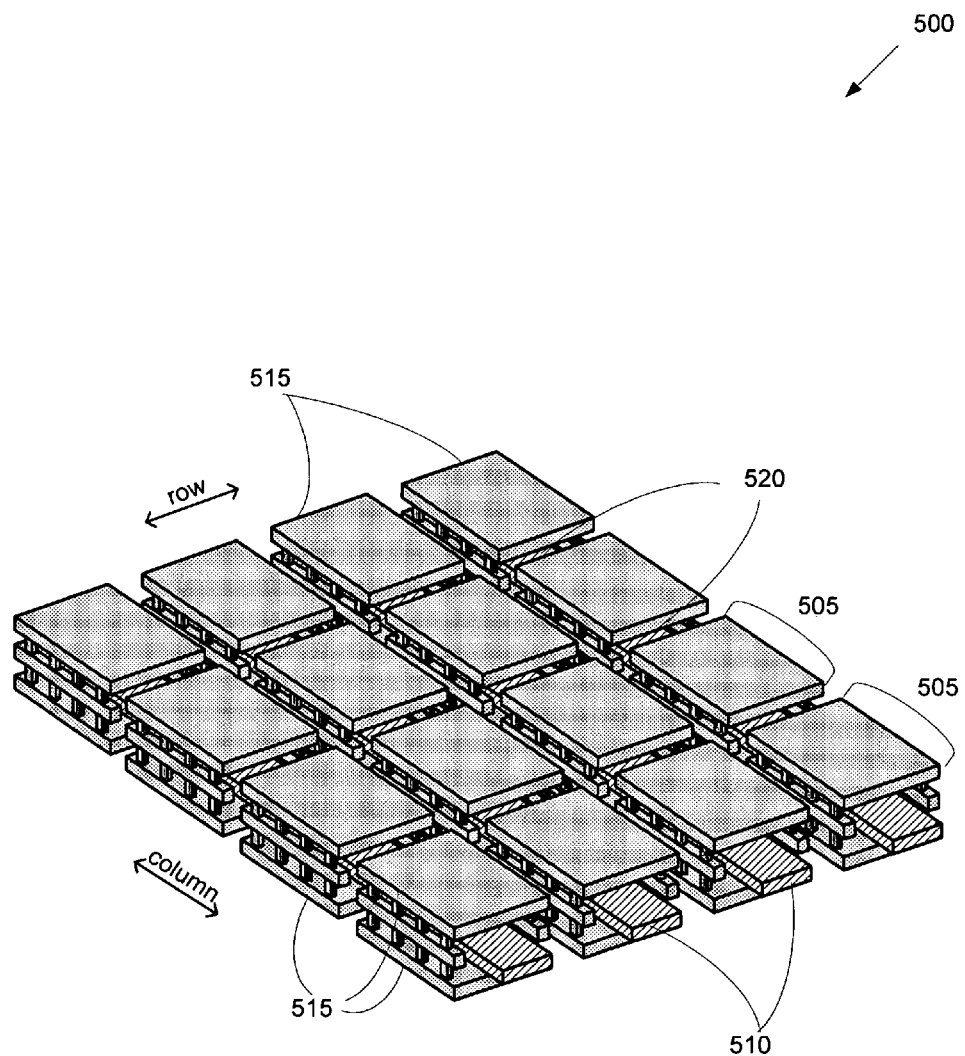
FIG. 5 shows a three dimensional diagram of a capacitor array comprising two or more layered capacitors.

In some embodiments, a capacitor array is provided comprising two or more layered capacitors. In some embodiments, the two or more layered capacitors have approximately equal capacitance values. FIG. 5 shows a three dimensional view of a capacitor array 500 comprising two or more layered capacitors 505 arranged in a predetermined number of columns and rows. FIG. 5 shows an example of a 4×4 array, but in other embodiments, arrays of other dimensions are used. Also, FIG. 5 shows an example of layered capacitors 505 having three layers, but in other embodiments, layered capacitors 505 having a different number of layers are used in the array.

Each layered capacitor 505 has a top plate 510 and a bottom plate 515. The top plates 510 of the layered capacitors 505 of a same column are coupled/connected to each together with a set of connectors 520 between the layered capacitors 505. In other embodiments, the top plate 510 of each layered capacitor 505 extends past the length of the bottom plate 515 of the layered capacitor 505 and couples/connects to the top plate 510 of an adjacent layered capacitor 505 in the same column. In these embodiments, the top plates 510 of the layered capacitors 505 of a same column can be viewed as a single unified top plate 510 that extends through each of the layered capacitors of the column.

Figure 6:
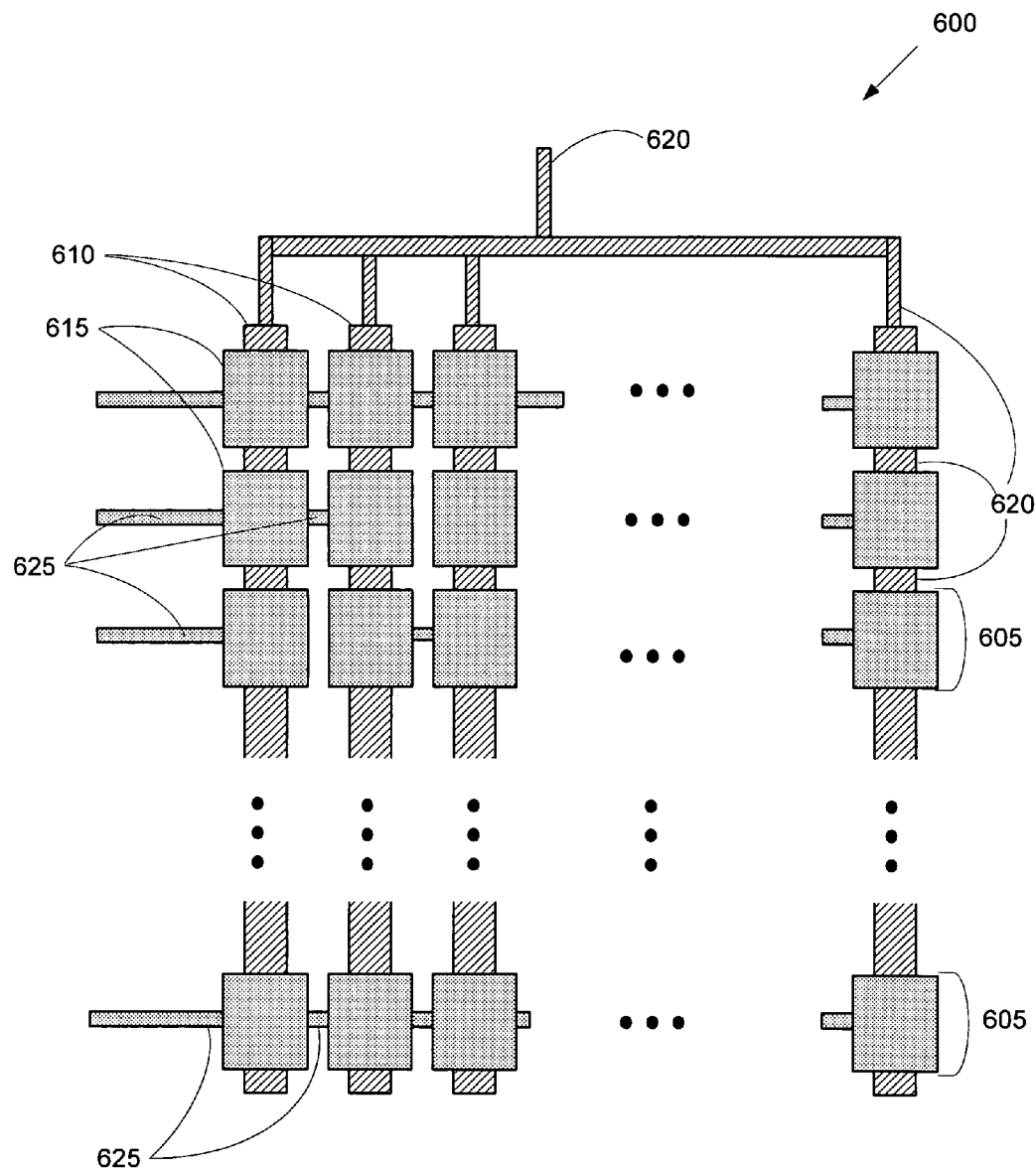
FIG. 6 shows a top view of a two dimensional capacitor array comprising two or more layered capacitors.

FIG. 6 shows a top view of a two dimensional capacitor array 600 comprising two or more layered capacitors 605 arranged in a predetermined number of columns and rows. In some embodiments, the number of columns is equal to the number of rows to create a square array. Top plates 610 of all layered capacitors 605 in the array 600 are coupled/connected to each together with a set of connectors 620. In some embodiments, connectors 620 are used to couple top plates 610 of layered capacitor 605 of the same column. In other embodiments, the top plate 610 of each layered capacitor 605 extends past the length of the bottom plate 615 and couples/connects to the top plate 610 of an adjacent layered capacitor 605 in the same column. In these embodiments, the top plates 510 of the layered capacitors 505 of a same column can be viewed as a single unified top plate 510 that extends through each of the layered capacitors of the column. The unified top plates 510 of the columns of the array 600 are then coupled to each other by connectors 620.

Bottom plates 615 of the layered capacitors 605 can be coupled/connected to together with connectors 625 to create combined capacitors of two or more layered capacitors 605. Since capacitance is proportional to the surface area of the plates, capacitance can be increased by increasing the area of the plates. As such, by connecting the bottom plates of two or more layered capacitors 605, capacitance can be increased. For example, if each of three layered capacitors has a capacitance of 1fF, a capacitance of 3fF can be created by connecting the bottom plates of three layered capacitors. In some embodiments, the capacitor array is used in a capacitive DAC and comprises the capacitor bank of the capacitive DAC. In these embodiments, the bottom plates of the layered capacitors are connected according to the DAC architecture. In some embodiments, the bottom plates are connected in a way to produce a binary weighted or segmented DAC. In some embodiments, the capacitor array is used in a capacitive DAC that is used in a SAR ADC.

For a binary weighted DAC, if a layered capacitor (whether having three, five, or another number of layers) is considered a single unit capacitor and is used for the LSB of the DAC, two units are connected to each other and used for the $2^{nd}$ LSB, four units are connected to each other and used for the $3^{rd}$ LSB, and so forth. Thus, for a binary weighted DAC having 10 bit resolution, the capacitors in the capacitor bank 105 and 205 from left to right would comprise 512 connected units (for the MSB), 256 connected units, 128 connected units, 64 connected units, 32 connected units, 16 connected units, 8 connected units, 4 connected units, 2 connected units, and 1 unit. Each set of connected units (e.g., 256 units) comprise a single capacitor in the bank 105 and 205 and is connected to the other processing circuits of the DAC according to the architecture of the DAC.

The size of the capacitor array is determined by the size of the single unit capacitor, which in turn is determined by how small the capacitor for the LSB can be while still maintaining accurate capacitance ratios between all capacitors. The size of the capacitor array is also determined by the resolution of the DAC which determines the number of unit capacitors needed in the array. For example, for a DAC with 10 bit resolution, 1023 total units are needed in the array which, for example, can be arranged as a 32×32 unit array providing 1024 units. In some embodiments, the unit capacitors are arranged in a two dimensional array having a predetermined number of columns and rows, the predetermined number of columns and rows being dependent on the resolution of the DAC. In some embodiments, the number of columns is equal to the number of rows to create a square array. In these embodiments, the number of columns and the number of rows is determined by the equation: $2^{(N/2)}$, where N equals the DAC resolution expressed in bits.

For a segmented DAC, the array of unit capacitors are connected according to a segmented architecture, which typically includes a digital decoder. The array of unit capacitors may be connected according to a segmented architecture using methods well known in the art which are not discussed in detail here.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

We claim:

1. A capacitor device array comprising:
    an array of at least two capacitor devices arranged in columns and rows,
        wherein each capacitor device comprises:
            a first layer comprising a first bottom plate portion of the capacitor device, the first bottom plate portion comprising the entirety of the first layer;
            a second layer comprising a first top plate portion of the capacitor device between two second bottom plate portions;
            a third layer comprising a third bottom plate portion of the capacitor device, the third bottom plate portion comprising the entirety of the third layer, wherein the third bottom plate portion is formed directly on top of the second layer; and
            a set of vias connecting the first, second, and third bottom plate portions,
        wherein all top plate portions of capacitor devices of a same column of the array are connected to form a unified top plate; and
    a set of connectors connecting the unified top plates of the columns of the array.

2. The capacitor device of claim 1, wherein:
    for a particular capacitor device in the array, the first top plate portion extends past the length of the first and second bottom plate portions to connect to a first top plate portion of an adjacent capacitor device in the same column of the array.

3. The capacitor device of claim 1, further comprising:
    a set of connectors connecting the top plate portions of capacitor devices of a same column of the array.

4. The capacitor device array of claim 1, wherein the capacitor device array is used in a capacitive digital-to-analog converter (DAC).

5. The capacitor device array of claim 4, wherein:
    the capacitive DAC has a resolution of a predetermined number of bits, from a least significant bit (LSB) to a most significant bit (MSB); and
    the capacitor devices are arranged in a two dimensional array having a predetermined number of columns and rows, the predetermined number of columns and rows being dependent on the resolution of the capacitive DAC.

6. The capacitor device array of claim 5, wherein the architecture of the DAC is a segmented architecture.

7. The capacitor device array of claim 6, wherein:
    the architecture of the DAC is a binary weighted architecture;
    the at least two capacitor devices have approximately equal capacitance values;
    a single capacitor device is coupled to the DAC for the LSB; and
    two capacitor devices are coupled to each other and coupled to the DAC for the next LSB.

8. The capacitor device array of claim 1, wherein the capacitor device array is used in a capacitive DAC that is used in a successive approximation analog-to-digital converter (SAR ADC).

9. A capacitive digital-to-analog converter (DAC) comprising:
    a capacitor device array comprising at least three capacitor devices arranged in columns and rows,
        wherein each capacitor device comprises:
            a first layer comprising a first bottom plate portion of the capacitor device, the first bottom plate portion comprising the entirety of the first layer;
            a second layer comprising a first top plate portion of the capacitor device between two second bottom plate portions;
            a third layer comprising a third bottom plate portion of the capacitor device, the third bottom plate portion comprising the entirety of the third layer, wherein the third bottom plate portion is formed directly on top of the second layer; and
            a set of vias connecting the first, second, and third bottom plate portions,
        wherein all top plate portions of capacitor devices of a same column of the array are connected to form a unified top plate; and
    a set of connectors connecting the unified top plates of the columns of the array; and
    one or more processing circuits coupled to the capacitor device array for converting a digital code into an analog signal using the capacitor device array,
    wherein the at least three capacitor devices are arranged in a two dimensional array having at least one column and at least one row.

10. The capacitive DAC of claim 9, wherein:
    the capacitive DAC has a resolution of a predetermined number of bits, from a least significant bit (LSB) to a most significant bit (MSB); and
    the capacitor devices are arranged in a two dimensional array having a predetermined number of columns and rows, the predetermined number of columns and rows being dependent on the resolution of the capacitive DAC.

11. The capacitive DAC of claim 10, wherein the architecture of the DAC is a segmented architecture.

12. The capacitive DAC of claim 10, wherein:
    the architecture of the DAC is a binary weighted architecture;
    the at least three capacitor devices have approximately equal capacitance values;
    a single capacitor device is used for the LSB; and
    two capacitor devices are coupled to each other and used for the next LSB.

13. The capacitive DAC of claim 9, wherein the capacitive DAC is used in a successive approximation analog-to-digital converter (SAR ADC).

14. The capacitive DAC of claim 9, wherein the two dimensional array having at least one column and at least one row is an array wherein the number of columns is equal to the number of rows.

* * * * *